United States Patent
Bartley et al.

(10) Patent No.: US 8,367,478 B2
(45) Date of Patent: Feb. 5, 2013

(54) METHOD AND SYSTEM FOR INTERNAL LAYER-LAYER THERMAL ENHANCEMENT

(75) Inventors: Gerald K. Bartley, Rochester, MN (US); Charles L. Johnson, Fort Myers, FL (US); John E. Kelly, III, Poughquag, NY (US); David R. Motschman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 13/151,672

(22) Filed: Jun. 2, 2011

(65) Prior Publication Data

US 2012/0306088 A1   Dec. 6, 2012

(51) Int. Cl.
| | |
|---|---|
| H01L 21/50 | (2006.01) |
| H01L 21/48 | (2006.01) |
| H01L 23/34 | (2006.01) |
| H01L 23/52 | (2006.01) |
| H01L 23/48 | (2006.01) |
| H01L 23/40 | (2006.01) |
| H01L 23/538 | (2006.01) |

(52) U.S. Cl. ........ 438/122; 438/109; 257/713; 257/777; 257/774; 257/621; 257/E23.174

(58) Field of Classification Search .................. 438/109, 438/122; 257/713, 777, 774, 621, E23.174
See application file for complete search history.

(56) References Cited

U.S. PATENT DOCUMENTS 5,506,753 A * 4/1996 Bertin et al. .................. 361/705
6,278,181 B1   8/2001 Maley (Continued)

FOREIGN PATENT DOCUMENTS

| JP | 2008124435 | 5/2008 |
|---|---|---|
| JP | 2009164152 | 7/2009 |

(Continued)

OTHER PUBLICATIONS

Smith, B.; Bonetti, A.; Gnos, T.; Michel, B. "Flow-induced spatial non-uniformity and anisotropy in electrically conductive adhesives." Semiconductor Thermal Measurement and Management Symposium, 2009. SEMI-THERM 2009. 25th Annual IEEE; Publication Year: 2009, pp. 304-308. Digital Object Identifier: 10.1109/STHERM.2009.4810780.

(Continued)

*Primary Examiner* — Luan C Thai
(74) *Attorney, Agent, or Firm* — Stachler Intellectual Property Law LLC

(57) ABSTRACT

The exemplary embodiments of the present invention provide a method and apparatus for enhancing the cooling of a chip stack of semiconductor chips. The method includes creating a first chip with circuitry on a first side and creating a second chip electrically and mechanically coupled to the first chip by a grid of connectors. The method further includes creating a cavity in a second side of the first chip between the connectors and filling the cavity with a thermal material. The chip stack of semiconductor chips with enhanced cooling apparatus includes a first chip with circuitry on a first side and a second chip electrically and mechanically coupled to the first chip by a grid of connectors. The apparatus further includes wherein portions of a second side of the first chip between the connectors is removed to provide a cavity in which a thermal material is placed.

20 Claims, 4 Drawing Sheets

U.S. PATENT DOCUMENTS

| | | | |
|---|---|---|---|
| 7,683,459 B2 * | 3/2010 | Ma et al. | 257/621 |
| 7,843,072 B1 * | 11/2010 | Park et al. | 257/774 |
| 7,876,565 B2 | 1/2011 | Hoivik et al. | |
| 2005/0046002 A1 * | 3/2005 | Lee et al. | 257/678 |
| 2008/0054444 A1 * | 3/2008 | Tuttle | 257/698 |
| 2009/0273068 A1 | 11/2009 | Kaskoun et al. | |
| 2009/0283898 A1 * | 11/2009 | Janzen et al. | 257/698 |
| 2009/0302445 A1 | 12/2009 | Pagaila et al. | |
| 2009/0321947 A1 * | 12/2009 | Pratt | 257/777 |
| 2010/0096759 A1 * | 4/2010 | Kirby et al. | 257/774 |
| 2010/0291735 A1 | 11/2010 | Ozguz et al. | |
| 2011/0031633 A1 | 2/2011 | Hsu et al. | |

FOREIGN PATENT DOCUMENTS

| | | |
|---|---|---|
| JP | 2010050259 | 3/2010 |

OTHER PUBLICATIONS

IPCOM000015477D. "Method to Increase Surface Area for Microelectronic Applications." IBM TDB Aug. 17, 2002. ip.com.

Linderman, R.J.; Brunschwiler, T.; Kloter, U.; Toy, H.; Michel, B. "IBM researchers unveil details of chip cooling breakthrough." Semiconductor Thermal Measurement and Management Symposium, 2007. SEMI-THERM 2007. 23rd Annual IEEE 2007.

* cited by examiner

METHOD AND SYSTEM FOR INTERNAL LAYER-LAYER THERMAL ENHANCEMENT

FIELD OF THE INVENTION

The present invention generally relates to thermal interface materials, and more particularly, to a method for enhancing internal layer-layer thermal interface performance and a device made from the method.

BACKGROUND

Thermal interfaces in microelectronics packages are commonly credited with a majority of the resistance for heat to escape from the chip to an attached cooling device (e.g. heat sinks, spreaders and the like). Thus, in order to minimize the thermal resistance between the heat source and cooling device, a thermally conductive paste, thermal grease or adhesive is commonly used. Thermal interfaces are typically formed by pressing the heat sink or chip cap onto the backside of the processor chip with a particle filled viscous medium between, which is forced to flow into cavities or non-uniformities between the surfaces.

It has been determined that stacking layers of electronic circuitry (i.e. 3 dimensional chip stack) and vertically interconnecting the layers provides a significant increase in circuit density per unit area. However, one significant problem of the three dimensional chip stack is the thermal density of the stack. For a four layer 3 dimensional chip stack, the surface area presented to the heat sink by the chip stack has only ¼ of the surface area presented by the two-dimensional approach. For a 4-layer chip stack, there are three layer-layer thermal interfaces in addition to the final layer to grease/heat sink interface. The heat from the bottom layers must be conducted up thru the higher layers to get to the grease/heat sink interface On the chip side (i.e. the heat source), there usually exists hotspots, areas of higher power density, where most of the processing takes place, which results in a temperature gradient across the chip. These areas of higher heat and power density need to be kept within a set temperature range in order for the chip to perform properly and to pass quality and specification tests at the end of manufacturing.

Control of temperature distribution has been addressed by changing chip design/architecture. However, this requires expensive redesign of the microprocessor that may influence other operating parameters and does not address the present issues facing current high performance microprocessors.

Accordingly, it would be desirable to provide for reduced thermal resistance between heat sources and a cooling device that is both efficacious and yet not require changes to the microprocessor fabrication process.

BRIEF SUMMARY

The exemplary embodiments of the present invention provide a method and system for enhancing internal layer-layer thermal interface performance.

An exemplary embodiment includes a method for enhancing the cooling of a chip stack of semiconductor chips. The method includes creating a first chip with circuitry on a first side and creating a second chip electrically and mechanically coupled to the first chip by a grid of connectors. The method further includes creating a cavity in a second side of the first chip between the connectors and filling the cavity with a thermal material.

Another exemplary embodiment includes a chip stack of semiconductor chips with enhanced cooling apparatus. Briefly described in terms of architecture, one embodiment of the apparatus, among others, is implemented as follows. The chip stack of semiconductor chips with enhanced cooling apparatus includes a first chip with circuitry on a first side and a second chip electrically and mechanically coupled to the first chip by a grid of connectors. The apparatus further includes wherein portions of a second side of the first chip between the connectors is removed to provide a cavity in which a thermal material is placed.

Another exemplary embodiment includes a system for enhancing the cooling of a chip stack of semiconductor chips. Briefly described in terms of architecture, one embodiment of the system, among others, is implemented as follows. The system includes the a means for creating a first chip with circuitry on a first side and a means for creating a second chip electrically and mechanically coupled to the first chip by a grid of connectors. The system further includes a means for creating a cavity in a second side of the first chip between the connectors and a means for filling the cavity with a thermal material.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

Figure 1:
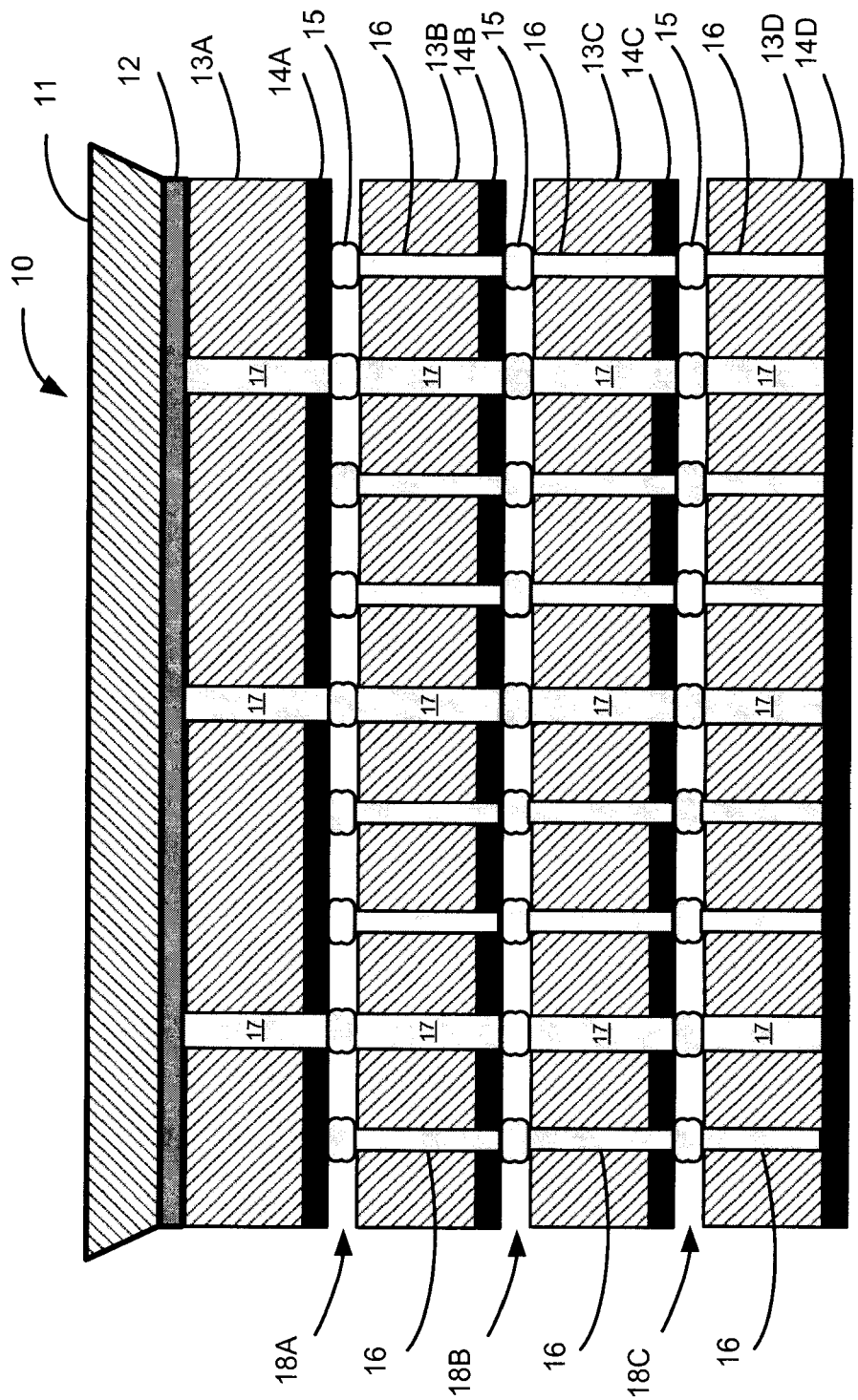
FIG. 1 is a prior art cross section block diagram illustrating an example of a controlled collapse chip connection (i.e. C4) or flip chip connection channels utilized in a silicon device stack.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

It is well established that the incorporation of certain types of materials with sufficient flow characteristics to "flow" and "fill" those gaps are not very thermally conductive. Materials with low-viscosity/high surface tension are required to fill the space between the layers of chips in a chip stack. Thermal properties of underfills and other adhesives are improved by mixing (or "filling") ceramic, metal, and/or other particulate or strands into the primary polymer or epoxy. Primarily due to the small capillary areas available in this configuration, identifying small enough particulate with adequate thermal properties is difficult.

According to the present disclosure, the thermal conductivity at desired locations can be increased by etching gaps in the chip substrate between the through silicon vias (i.e. TSV or bond pads). By increasing the size of the gaps in the non-active side of the chip substrate, more temperature conductive material can be inserted between the multiple substrates in a chip stack.

The loss of the little bit of silicon to the heat transfer mechanism is offset well by eliminating the air gap and/or lower conductivity epoxy fill materials. The gaps can be created by reactive-ion etching (i.e. RIE), wet etch processes, laser milling, as part of the wafer thinning process with grinding/partial sawing, and/or similar processes. The gaps may be of any shape including, but not limited to, triangular, rectangular, circular, elliptical, irregular or any four or more sided shape. Choice of the shape of the gaps may be a function of processing, spacing to other blockages, or to enhance capillary behavior. Filling can be done by vacuum draw, injection mold, or screen/clean/cure/planarize.

The advantage of this solution is that it further reduces chip temperatures through only a small modification to the chip surface and does not require changes to the manufacturing line or the addition of more components to the system such as liquid coolants and microchannel heat exchangers.

FIG. 1 is a prior art cross section block diagram illustrating an example of a controlled collapse chip connection 15 (i.e. C4) or flip chip electrically conductive channels 16 and thermal conductive channels 17 utilized in a chip stack 10.

The chip stack 10 comprises a multitude of chips 13 (A-D) that further include one or more conductive channels 16, which extend through a chip 13 from the top surface to the bottom surface. In one embodiment, the "conductive channel" is really a combination of two or more thru-silicon-vias (TSVs) connected sequentially by one or more controlled collapse chip connection 15 (C4s).

Preferably, the electrically conductive channels 16 are formed of tungsten or copper; however, other conductive materials may be used and are contemplated. The conductive channels 16 selectively conduct electrical signals to and from to portions of the circuitry 14 thereon or simply couple to solder bumps 15 to interconnect differing chips 13 in the stack 10 (e.g., chips 13A and 13B), or both.

Preferably, the thermal conductive channels 17 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of thermal conductive channels 17 use micronized or pulverized silver. Another type of thermal conductive channels 17 are the phase-change materials. The phase change materials are solid at room temperature, but liquefy and behave like grease at operating temperatures. The thermal conductive channels 17 conduct heat to and from to portions of the circuitry 14 thereon, couple to solder bumps 15 to interconnect differing chips 13 in the stack 10 (e.g., chips 13A and 13B), or couple to heat sink 11 through thermal grease 12.

The conductive channels 16 couple to solder bumps 15 on a bond pad 29 on the bottom surface of chip 13A-C. Although now shown for the sake of simplicity, the solder bumps 15 are electrically isolated from the chip 13 and one another according to conventional practice. In addition, the conductive channels 16 are preferably electrically insulated from the chip 13 by insulating regions (not shown) which are disposed between the conductive channels 16 and the chip 13. The insulating regions preferably are silicon dioxide ($SiO_2$); however, other insulating materials may be employed and are contemplated as falling within the scope of the present invention. The insulating regions prevent the signals being transmitted in the electrically conductive channels 16 from disturbing the bias voltage of the chip 13 (which are typically either a ground potential or a Vdd). Of course, in some cases, one of the terminals of the circuitry 14 on the top surface may be held at a substrate potential, in which case, the appropriate electrically conductive channel 16 may be non-insulated and thus be in electrical contact with the chip 13 being held at a similar potential, as may be desired.

As shown, each chip 13 uses conductive channels 16 in a controlled, collapse chip connection (C4) structure (also often called solder bump or flip-chip bonding). The chip stack 10 includes a base chip 13A. Solder bump 15 are then placed on a bond pad 29 for the conductive channel 16 of a second (or top) chip 13A, which is oriented face-down (i.e., flip-chip), aligned and brought into contact with the conductive channels 16. Electrical interconnections between the electrically conductive channels 16 are formed by heating the solder bumps 15 to a reflow temperature, at which point the solder flows. After the solder flows, subsequent cooling results in a fixed, electrically conductive joint to be formed between the electrically conductive channels 16.

The base chip 13A on one side is attached to a heat sink 11 with thermal grease 12. Other chips 13B-13D can have C4 connection structures implemented on both the top surface and bottom surface thereof, as illustrated in prior art FIG. 1. In such instances, a second chip 13B may similarly be oriented facedown with respect to the base chip 13A and coupled thereto-using solder bump 15 A-C.

The C4 structure of prior art FIG. 1 overcomes one disadvantage of the connection methodologies. Initially, because the ball-bonding attachment technique is avoided, significantly less stress is placed on the solder bump 15 during connection, which allows circuitry 14A-C to be formed under the solder bump 15. The circuitry 14A-C is formed according to any one of many conventional semiconductor processing techniques. However, the C4 structure of prior art FIG. 1 has one major disadvantage of not being able to dissipate the heat generated by circuitry 14 A-D. For example, the small gap 18A between a first or base chip 13A and a second chip 13B is minimal due to the small capillary areas available in this configuration. This small gap 18B and 18C is replicated between each of the substrates in the chip stack 10. Identifying small enough particulate with adequate thermal properties is difficult.

Figure 2:
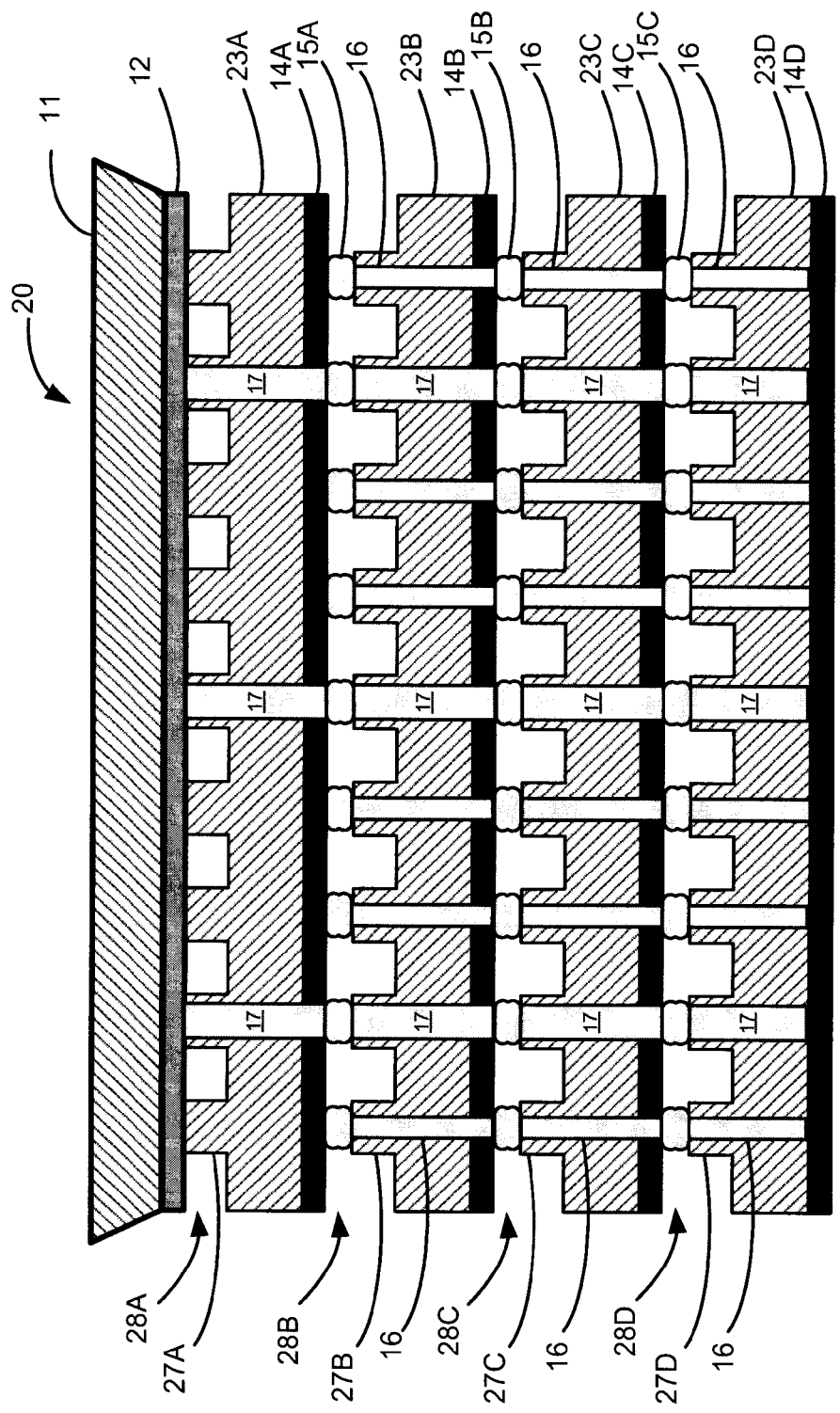
FIG. 2 is a cross section block diagram illustrating an example of the C4 or flip chip connection channels utilized in a silicon device stack utilizing the gap etching of the present invention.

FIG. 2 is a cross section block diagram illustrating an example of the C4 or flip chip electrically conductive channels 16 and thermal conductive channels 17 utilized in a silicon device stack 20, utilizing the gap etching method 100 of the present invention. The silicon device stack 20 is substantially similar to the chip stack 10 of the prior art with one important improvement, the etched gaps 28A-D. According to the present disclosure, the thermal conductivity at desired locations is increased by etching gaps 28A-D in the multiple chips 23A-D between the solder bumps 15 and thermal grease 12. By increasing the size of the etched gaps 28A-D in the non-active side of the multiple chips 23A-D, more thermal interface material can be inserted between the multiple chips 23A-D in a silicon device stack 20.

The loss of the little bit of silicon to the heat transfer mechanism is offset well by eliminating the air gap and/or lower conductivity epoxy fill materials. In one embodiment, etched channel/gap shown as 28A is optional. It is just as likely that the material used in the thermal interface 12 between the die stack 10 and the heatsink 11 would fill that region. The gaps 28 A-D can be created by reactive-ion etching (i.e. RIE), wet etch processes, laser milling, as part of the wafer thinning process with grinding/partial sawing, and/or similar processes. Filling can be done by vacuum draw, injection mold, or screen/clean/cure/planarize.

The advantage of this solution is that it further reduces chip temperatures through only a small modification to the chip surface and does not require changes to the manufacturing line or the addition of more components to the system such as liquid coolants and microchannel heat exchangers. In one embodiment, etched gaps 28A-D maybe etched to be in contact with thermal conductive channels 17 in order to provide enhanced thermal conductivity.

Figure 3:
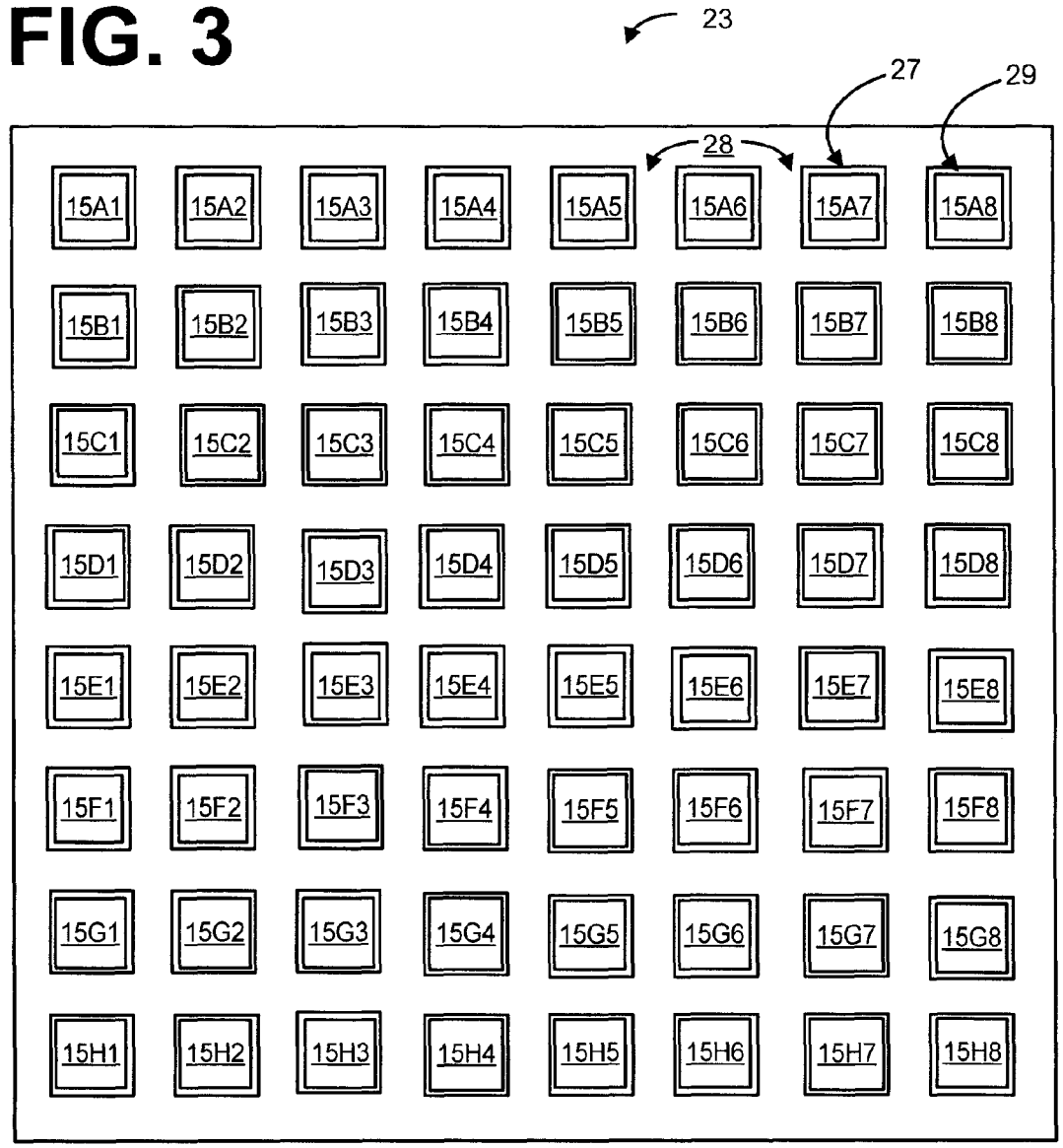
FIG. 3 is a block diagram illustrating an example of a silicon device having a plurality of bond pads formed at various locations thereon.

FIG. 3 is a block diagram illustrating an example of a chip 23 having a plurality of substrate pillars 27 with bond pads 29 formed at various locations thereon. The solder bumps 15 are formed on the bond pads 29, which are on top of the substrate pillars 27 and conductive channels 16, on the chip 23. The solder bumps 15 now rest on conductive channels 16 and bond pads 29 due to the etching of gaps 28A-D.

As shown, the plurality of solder bumps 15, bond pads 29 and substrate pillars 27 are square, however, this is for illustration only and the solder bumps 15, bond pads 29 and substrate pillars 27 may be of any shape including, but not limited to, triangular, rectangular, circular, elliptical, irregular or any four or more sided shape. The size and shape of bond pads 29 are generally determined by the size and shape of solder bump 15. This is in order to provide a support for the solder bumps 15.

Also as shown, the solder bumps 15, bond pads 29 and substrate pillars 27 in one embodiment are laid out in regular patterns, however, this is for illustration only and the solder bumps 15, bond pads 29 and substrate pillars 27 have the flexibility to be laid out in any desired pattern. This additional level of flexibility allows the circuitry 14A-C to be laid out without regard to the solder bumps 15 and substrate pillars 27 locations. This further allows the solder bumps 15 locations above the circuitry 14A-C to be located in an optimized fashion, to directly couple with circuitry on another chip 23. In another embodiment, the solder bumps 15 and substrate pillars 27 may be formed in a pattern where the conductive channels 16 provide power at the periphery of the chip 23 to aid in cooling the chip 23. Therefore, the solder bumps 15 and substrate pillars 27 may be located anywhere on the chip 13A-D as illustrated in FIG. 3, without the need to form such interconnections on peripheral edges of the die.

A thermal interface material is used to fill the gaps 28 A-D between thermal transfer surfaces, such as between chips 23 A-D, microprocessors and heat sinks, in order to increase thermal transfer efficiency. These gaps 28 A-D are normally filled with air, which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials is the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials latent heat storage can be achieved through solid-solid, solid-liquid, solid-gas and liquid-gas phase change. However, the only phase change used for phase change materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

Figure 4:
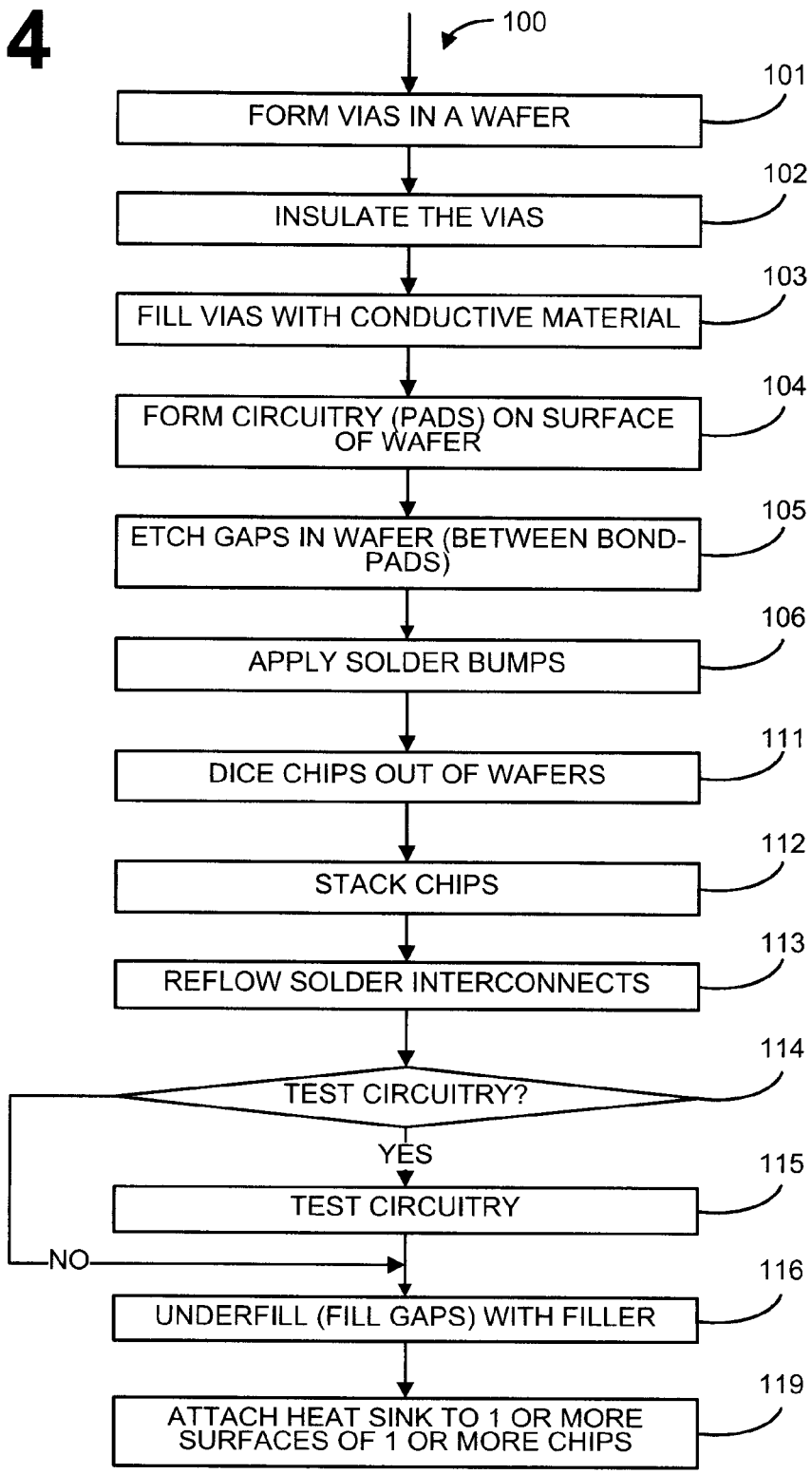
FIG. 4 is a flow chart illustrating an example of a method of forming and etching a silicone device utilizing the gap etching of the present invention.

FIG. 4 is a flow chart illustrating an example of a method of forming and etching a chip 23 utilizing the gap etching method 100 of the present invention. There are a couple approaches to forming the individual chips 23, and subsequent assembly, so the following is just one method of providing for the etching of gap 28 on silicon devices in a multilayer layer stack.

At step 101, conductive channels 16 and 17 (i.e. vias) are formed within a chip 23 on a wafer (not shown). At step 102, the electrically conductive channels 16 are insulated. In one embodiment, the insulating regions are silicon dioxide ($SiO_2$). However, other insulating materials may be used and are contemplated as falling within the scope of the invention. At step 103, the electrically conductive channels 16 are filled with a conductive material. In one embodiment, the conductive material may be comprised of either aluminum or copper. However, other conductive materials may be used and are contemplated as falling within the scope of the invention. In another embodiment, the thermal conductive channels 17 are filled with thermal grease, that is typically silicone oil filled with a conductive particulate such as for example, but not limited to, aluminum oxide, zinc oxide, boron nitride, diamond, synthetic diamond, beryllium, and the like. However, other conductive materials may be used and are contemplated.

At step 104, the circuitry 14 is formed on the surface of chip 23. The circuitry 14 is formed thereon according to any one of many conventional semiconductor processing techniques. In one embodiment, the bond pads 29 are created when the circuitry 14 is formed. At step 105, gaps 28 are etched into the chip 23 creating substrate pillars 27 with bond pads 29. In one embodiment, the etched gaps 28A-D are created using reactive-ion etching (i.e. RIE), wet etch processes, laser milling, as part of the wafer thinning process with grinding/partial sawing, and/or similar processes. The bond pads now rest on substrate pillars 27 due to the etching of gaps 28A-D. In one embodiment, the size and shape of substrate pillars 27 are generally determined by the size and shape of solder bumps 15. This is to provide a minimum support for solder bumps 15. In another embodiment, the etching of the gaps 28 in the chip 23 may be performed prior to forming bond pads 29 on the surface of the chip 23.

The solder bumps 15 are then formed on the bond pads 29 that are on the bottom surface of the chip 23, at step 106. These solder bumps 15 are generally in alignment with the electrically conductive channels 16 in order to conduct electrical signals. In an alternative embodiment, thermal conductive channels 17 may conduct heat instead of electronic signals and use a solder bump 15 with thermal conductive ability. In one embodiment, a homogenous process could be used to create solders bump 15 for both electrically conductive channels 16 and any thermal conductive channels 17. In an alternative embodiment, the solder bumps 15 adhere to substantial portion of substrate pillars 27.

At step 111, the wafer (not shown) containing chips 23 are diced into individual chips. Chips of appropriately sized geometry (length X and width Y thickness) are cut from the wafer using conventional techniques known to those skilled in the art. The geometry is dictated by the footprint of the circuitry 14 on chip 23. At step 112, the chips 23 in the chip stack 10 are assembled. Example of this is to have the bottom surface of a first chip 23A coupled to a top surface of a second chip 23B.

At step 113, the chip stack 10 is heated to a reflow temperature, at which point the solder in the solder bumps 15 flows. Subsequent cooling results in a fixed, electrically conductive joint to be formed between the electrically conductive channels 16, for example channels 16A and 16B.

At step 114, it is determined if the circuitry 14 on chips 23 in chip stack 10 are to be tested. If it is determined in step 114 that testing the circuitry 14 in the chip stack 10 is not to be performed, then the gap etching method 100 skips this step 116. However, if it is determined at step 114 that the circuitry 14 on chips 23 in chip stack 10 are to be tested, then the circuitry 14 is tested for electrical performance, at step 115.

At step 116, the gaps between the chips 23 A-D and chip stack 10 are filled with thermal filler. The thermal filler material is used to fill the etched gaps 28 A-D between thermal transfer surfaces, such as between chips 23 A-D, microprocessors and heat sinks, in order to increase thermal transfer efficiency. A thermal filler material may take on many forms. In one embodiment, a white-colored paste or thermal grease, typically, silicone oil filled with aluminum oxide, zinc oxide, or boron nitride is used. In another embodiment, the thermal interface materials may use micronized or pulverized silver. In still another embodiment, the thermal interface materials may use phase-change materials. The phase change materials are solid at room temperature, but liquefy and behave like grease at operating temperatures.

In one embodiment, the thermal filler is consistent throughout an etched gap 28. In an alternative embodiment, an etched gap 28 may comprise multiple materials. In the alternative embodiment, a first thermal filler material may be used to fill the lower portion of the etched gap 28, and a second thermal filler material to fill the upper portion of the etched gap 28. In this alternative embodiment, the first filler material may be electrically conductive because it is isolated from solder bumps 15 by the second filler material and substrate pillars 27. In this way, a first more highly thermal conductive material may be utilized even if it is electrically conductive due to its isolation from solder bumps 15.

At step 119, the gap etching method 100 attaches a heat sink 11 to one or more surfaces of one or more chips 23.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A method for enhancing the cooling of a chip stack of semiconductor chips, comprising:
   creating a first chip with circuitry on a first side;
   creating a second chip electrically and mechanically coupled to the first chip by a grid of connectors;
   creating a cavity in a second side of the first chip between the connectors; and
   filling the cavity with a thermal material.

2. The method of claim 1, wherein the cavity is created by removing material from the first chip.

3. The method of claim 2, wherein the cavity is created using an etching process.

4. The method of claim 2, wherein the cavity is created using a milling process.

5. The method of claim 1, wherein the thermal material is a thermal grease that includes a conductive particulate.

6. The method of claim 1, wherein the thermal material comprises:
   a first thermal filler material used to fill a lower portion of the cavity; and
   a second thermal filler material used to fill an upper portion of the cavity.

7. The method of claim 6, wherein the first thermal filler material in the cavity is electrically isolated from the grid of connectors.

8. A system for enhancing the cooling of a chip stack of semiconductor chips, comprising:
   a means for creating a first chip with circuitry on a first side;
   a means for creating a second chip electrically and mechanically coupled to the first chip by a grid of connectors;
   a means for creating a cavity in a second side of the first chip between the connectors; and
   a means for filling the cavity with a thermal material.

9. The system of claim 8, wherein the means for creating cavity is created by a means for removing material from the first chip.

10. The system of claim 8, wherein the means for creating cavity is an etching process.

11. The system of claim 8, wherein the means for creating cavity is a milling process.

12. The system of claim 8, wherein the thermal material is a thermal grease that includes a conductive particulate.

13. The system of claim 8, wherein the thermal material comprises:
   a first thermal filler material used to fill a lower portion of the cavity; and
   a second thermal filler material used to fill an upper portion of the cavity.

14. The system of claim 13, wherein the first thermal filler material in the cavity is electrically isolated from the grid of connectors.

15. A chip stack of semiconductor chips with enhanced cooling comprising:
   a first chip with circuitry on a first side;
   a second chip electrically and mechanically coupled to the first chip by a grid of connectors; and
   wherein portions of a second side of the first chip between the connectors is removed to provide a cavity in which a thermal material is placed.

16. The apparatus of claim 15, wherein the cavity is created using an etching process.

17. The apparatus of claim 15, wherein the cavity is created using a milling process.

18. The apparatus of claim 15, wherein the thermal material is a thermal grease that includes a conductive particulate.

19. The apparatus of claim 15, wherein the thermal material comprises:
   a first thermal filler material used to fill the lower portion of the cavity; and
   a second thermal filler material used to fill the upper portion of the cavity.

20. The apparatus of claim 19, wherein the first thermal filler material in the cavity is electrically isolated from the grid of connectors.

* * * * *